United States Patent
Kliesch et al.

(10) Patent No.: US 7,105,223 B2
(45) Date of Patent: *Sep. 12, 2006

(54) SINGLE-LAYER, ORIENTED THERMOPLASTIC POLYESTER FILM CAPABLE OF STRUCTURING BY MEANS OF ELECTROMAGNETIC RADIATION, FOR PRODUCING SELECTIVELY METALLIZED FILMS

(75) Inventors: Holger Kliesch, Mainz (DE); Thorsten Kiehne, Wiesbaden (DE); Gottfried Hilkert, Saulheim (DE); Bodo Kuhmann, Runkel (DE)

(73) Assignee: Mitsubishi Polyester Film GmbH, Wiesbaden (DE)

( * ) Notice: Subject to any disclaimer, the term of this patent is extended or adjusted under 35 U.S.C. 154(b) by 37 days.

This patent is subject to a terminal disclaimer.

(21) Appl. No.: 10/941,715

(22) Filed: Sep. 15, 2004

(65) Prior Publication Data

US 2005/0069688 A1 Mar. 31, 2005

(30) Foreign Application Priority Data

Sep. 24, 2003 (DE) ................................ 103 44 512

(51) Int. Cl.
*B32B 27/08* (2006.01)
*B32B 27/16* (2006.01)
*B32B 27/18* (2006.01)
*B32B 27/20* (2006.01)
*B32B 27/36* (2006.01)

(52) U.S. Cl. ...................... 428/331; 428/323; 428/328; 428/332; 428/338; 428/339; 428/447; 428/480; 428/910; 264/288.4; 264/290.2; 522/81; 522/83; 524/401; 524/402; 524/406; 524/434; 524/435; 524/439; 524/440

(58) Field of Classification Search ..................... None
See application file for complete search history.

(56) References Cited

U.S. PATENT DOCUMENTS

| | | | | | |
|---|---|---|---|---|---|
| 4,328,303 | A | * | 5/1982 | Ronn et al. ................. | 430/290 |
| 5,334,292 | A | * | 8/1994 | Rajeshwar et al. ......... | 205/419 |
| 5,470,637 | A | | 11/1995 | Sakamoto et al. .......... | 428/143 |
| 5,519,338 | A | * | 5/1996 | Campbell et al. ............. | 326/27 |
| 5,637,440 | A | * | 6/1997 | Ogi et al. ................ | 430/270.1 |
| 5,728,339 | A | * | 3/1998 | Farrar ........................ | 264/134 |
| 6,319,564 | B1 | * | 11/2001 | Naundorf et al. ........... | 427/531 |
| 2002/0065346 | A1 | * | 5/2002 | Murschall et al. .......... | 524/323 |
| 2003/0087105 | A1 | * | 5/2003 | Murschall et al. ........ | 428/423.7 |
| 2003/0108754 | A1 | * | 6/2003 | Murschall et al. .......... | 428/480 |
| 2005/0064711 | A1 | * | 3/2005 | Kliesch et al. ............. | 438/689 |
| 2005/0069688 | A1 | * | 3/2005 | Kliesch et al. ............. | 428/220 |
| 2005/0069689 | A1 | * | 3/2005 | Kliesch et. al. ............. | 428/220 |

FOREIGN PATENT DOCUMENTS

| | | |
|---|---|---|
| DE | 197 23 734 A1 | 12/1998 |
| EP | 1 274 288 A1 | 1/2003 |
| JP | 7166034 | 6/1995 |

OTHER PUBLICATIONS

Schimtz, Peter et al., "Films.". Ullmann's Encyclopedia of Industrial Chemistry, 5th Ed., vol. A11 (1988), pp. 85-95, 108-110.*

* cited by examiner

Primary Examiner—Vivian Chen
(74) Attorney, Agent, or Firm—ProPat, L.L.C.

(57) ABSTRACT

The invention relates to a single-layer, oriented polyester film where the polyester comprises an additive which on irradiation with electromagnetic radiation forms metal nuclei on which further metal can be accumulated during further steps of the process. The invention further relates to a process for producing this film and to its use in printed circuit boards, ribbon cables, smart cards, RFID labels, membrane keyboards, and film-based circuits, of any type.

20 Claims, 1 Drawing Sheet

SINGLE-LAYER, ORIENTED THERMOPLASTIC POLYESTER FILM CAPABLE OF STRUCTURING BY MEANS OF ELECTROMAGNETIC RADIATION, FOR PRODUCING SELECTIVELY METALLIZED FILMS

CROSS REFERENCE TO RELATED APPLICATIONS

This application claims priority to German Patent Application 103 44 512.9, filed Sep. 24, 2003, hereby incorporated herein in its entirety.

FIELD OF THE INVENTION

The invention relates to a single-layer, oriented polyester film where the polyester comprises an additive which on irradiation with electromagnetic radiation forms metal nuclei on which further metal can be accumulated during further steps of the process. The invention further relates to a process for producing this film and to its use in printed circuit boards, ribbon cables, smart cards, RFID labels, membrane keyboards, and film-based circuits, of any type.

BACKGROUND OF THE INVENTION

The use of polyester films for electrical insulation applications is prior art. The ever more stringent requirements relating to complexity of the circuits within a small space, together with the need to be able to produce these circuits rapidly, flexibly, and at low cost places stringent technological requirements on the film and on the steps within further processing.

Conventional processes for producing flexible circuits mostly relate to the full-surface metalization of the film web or lamination of the film web to metal foil and subsequent structuring of the resultant conductive surfaces by various processes, e.g. etching or mechanical removal of the undesired quantities of metal. There are also processes in which an embossment/print is applied to the metal, or a conductive paste composed of carbon/silver is applied. Disadvantages of these processes lie in their low flexibility and precision, which results in a relatively large separation between the conductor tracks, and/or the high costs associated with these processes, and/or the low production rates.

EP-A-1 274 288 describes a process in which laser irradiation is used to form copper nuclei from copper-containing metal oxides, and a subsequent electroplating step deposits further copper on the nuclei. That specification describes exclusively injection-molded parts, and there is no indication as to how and whether the process can be applied to polyester films and films generally. In particular, there is no indication of the nature of the polymers and additives needed to permit production of oriented films. The PBT/$SiO_2$/spinel compounded material described in EP-A-1 274 288 is unsuitable for producing oriented films because the high crystallization rate of the polybutylene terephthalate used and the high level of filling with fumed silica prevent reliable processing of this polymer.

In particular, there is no indication as to how it is possible to produce a film with adequate dimensional stability under conditions of local heating after irradiation with electromagnetic radiation and further processing.

SUMMARY OF THE INVENTION

It was an object of the present invention to provide a film which does not have the disadvantages mentioned and which comprises a compound activatable by radiation which forms metal nuclei on which further metal can be accumulated in further steps of the process. A further object was that this film not only has low production cost and good orientability but also has good mechanical properties, i.e. high longitudinal and transverse tensile strength, high longitudinal and transverse modulus of elasticity, high longitudinal and transverse elongation at break, and high longitudinal and transverse tensile stress to generate a tensile strain of 5% (F5 value), together with defined shrinkage.

DETAILED DESCRIPTION OF THE INVENTION

Figure 1:
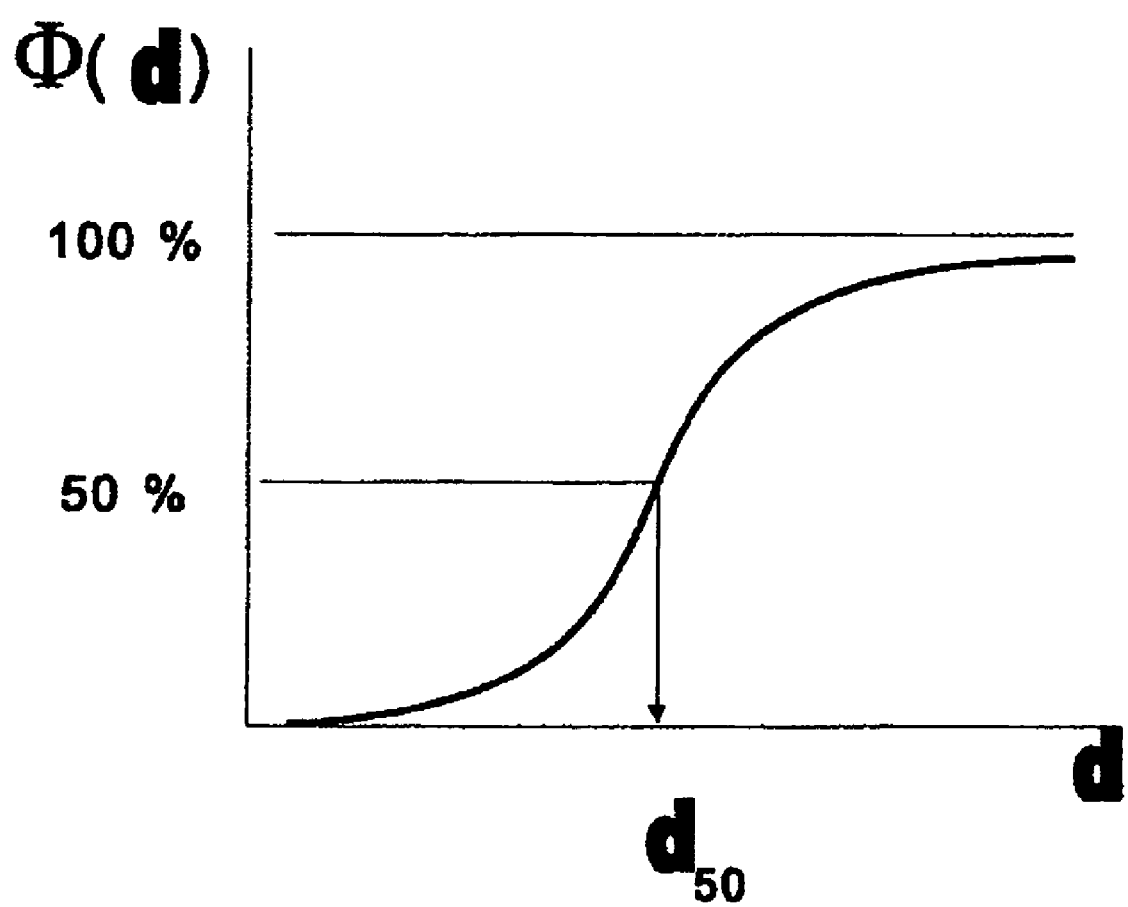
FIG. 1 is a graphical illustration of an exemplary particle size distribution curve.

This object is achieved via a single-layer, at least monoaxially stretched polyester film with a thickness of from 5 to 500 µm (preferably from 12 to 200 µm, and particularly preferably from 30 to 150 µm), which preferably comprises from 0.1 to 15% by weight (preferably from 1.0 to 10% by weight and particularly preferably from 2.0 to 8.0% by weight)—based on the film—of a metal compound capable of activation by electromagnetic radiation.

A compound capable of activation by radiation is a metal-containing (inorganic or organic) compound which as a consequence of absorbing electromagnetic radiation liberates metal in elemental form in a chemical reaction. This chemical reaction can also involve other reactants. It is also possible that the electromagnetic radiation is not directly absorbed by the metal-containing compound but by other substances which then transfer the absorbed energy to the metal-containing compound and thus bring about the liberation of elemental metal. The electromagnetic radiation may be UV light (wavelength from 100 to 400 nm), visible light (wavelength from 400 to 800 nm), or infrared light (wavelength from 800 to 25 000 nm), the use of infrared light being preferred. Other preferred forms of radiation are X-ray, gamma, and particle beam (electron beam, α-radiation, and β-radiation).

The accumulation of further metal onto the metal nuclei generated by electromagnetic radiation preferably takes place via electroplating (solution chemistry) processes.

Good capability for orientation includes excellent capability of the film, during its production, to undergo monoaxial or biaxial orientation without break-offs.

The good mechanical properties include, inter alia, high modulus of elasticity in at least one direction of the film (longitudinal direction (MD) and/or transverse direction (TD)) of greater than 500 N/mm², preferably greater than 2000 N/mm², and particularly preferably greater than 4000 N/mm², and also high tensile strength values in at least one direction of the film (longitudinal direction (MD) and/or transverse direction (TD)) of greater than 50 N/mm², preferably greater than 100 N/mm², and particularly preferably greater than 150 N/mm², and high elongation at break values in at least one direction of the film (longitudinal direction (MD) and/or transverse direction (TD)) of greater than 10%, preferably greater than 40%, and particularly preferably greater than 80%.

In one preferred embodiment, the shrinkage of the inventive film at 200° C. is not greater than 25% in any direction of the film (neither MD nor TD). Indeed, shrinkage at 200° C. is preferably smaller than 15%, and particularly preferably smaller than 5%.

The main polymer constituent (i.e. 55 to 100% by weight, preferably from 70 to 100% by weight, and particularly preferably from 90 to 100% by weight) present in the inventive film is a polyester.

According to the invention, a polyester is
a homopolyester,
a copolyester,
a blend of various polyesters, and these may be used either in the form of pure polymers or else in the form of polyesters comprising recycled material.

Polyesters contain repeat units which derive from dicarboxylic acids (100 mol %) and from diols (likewise 100 mol %). The inventive polyesters are preferably based on terephthalic acid or 2,6-naphthalene-dicarboxylic acid as dicarboxylic acid and on ethylene glycol as diol.

In particular, the inventive polyesters contain from 10 to 100 mol % of terephthalate or from 10 to 100 mol % of 2,6-naphthalate as dicarboxylic acid components (the total amount of dicarboxylic acid components making up 100 mol %). Other dicarboxylic acid components which may be present in the inventive polyester are from 0 to 50 mol % of 2,6-naphthalate (if terephthalate was used as main component), from 0 to 50 mol % of terephthalate (if naphthalate was used as main component), from 0 to 20 mol % of isophthalate (preferably from 0.5 to 4 mol %), and also from 10 to 60 mol % of 4,4'-diphenyl-dicarboxylate. Other dicarboxylic acid components, such as 1,5-naphthalenedicarboxylate, should not exceed a proportion of 30 mol %, preferably 10 mol %, in particular 2 mol %.

As diol component, the inventive polyester contains from 10 to 100 mol % of ethylene glycol (EG) (the entire amount of diol components making up 100 mol %). The proportion of diethylene glycol should not exceed 10 mol %, and is ideally from 0.5 to 5 mol %. Other diol components, such as cyclohexanedimethanol, 1,3-propanediol, 1,4-butanediol should not exceed a proportion of 50 mol %, their proportion preferably being less than 30 mol %, particularly preferably less than 10 mol %.

Besides the main polymer constituents mentioned, other embodiments of the film may contain up to 45% by weight (preferably up to 30% by weight, particularly preferably up to 20% by weight, based on the weight of the film) of other polymers, such as polyetherimides (e.g. ®Ultem 1000 from GE Plastics Europe, NL), polycarbonate (e.g. ®Makrolon from Bayer, DE), polyolefins, such as COCs (e.g. ®Topas from Ticona, DE), polyamides (®Ultramid from BASF, DE), etc.

The polyesters are generally prepared by processes known from the literature from the dicarboxylic acid or dicarboxylic ester and the diols mentioned. The polyesters may either be prepared by the trans-esterification process using the usual catalysts, e.g. salts of Zn, of Ca, of Li, or of Mn, or by the direct esterifiction process.

The compound capable of activation by radiation is composed of electrically non-conductive high-thermal-stability organic or inorganic metal compounds which are preferably insoluble and stable in aqueous acidic or alkaline metalizing baths. Particularly suitable compounds are those which have maximum light absorption, in particular in the IR region. Compounds of this type are described in EP-A-1 274 288. Preference is given here to compounds of metals of the d- and f-group of the Periodic Table of the Elements with non-metals. The metal-containing compounds are particularly preferably metal oxides, in particular monooxides of the d-metals of the Periodic Table of the Elements. Higher metal oxides are particularly suitable. In one particularly preferred embodiment of the invention, the higher oxides are spinels, in particular copper-containing spinels, such as $CuCr_2O_4$. Suitable copper-containing spinels are commercially available, an example being PK 3095 from Ferro (DE) or 34E23 or 34E30 from Johnson Matthey (DE).

The concentration of these compounds present in the inventive film is from 0.1 to 15% by weight, preferably from 1.0 to 10% by weight, and particularly preferably from 2.0 to 8.0% by weight.

If the metal-containing compound is not soluble in the polyester used for the production of the film, the particles have an average size ($d_{50}$ value) of from 0.01 to 20 μm, preferably from 0.05 to 10 μm, and particularly preferably from 0.1 to 5 μm.

Besides the compound capable of activation by radiation, the inventive film may comprise other particulate additives, such as fillers and antiblocking agents. Typical fillers and antiblocking agents are inorganic and/or organic particles, such as silicon dioxide (natural, precipitated, or fumed), calcium carbonate, magnesium carbonate, barium carbonate, calcium sulfate, barium sulfate, lithium phosphate, calcium phosphate, magnesium phosphate, titanium dioxide (rutile or anatase), kaolin (hydrated or calcined), aluminum oxide, aluminum silicates, lithium fluoride, the calcium, barium, zinc, or manganese salts of the dicarboxylic acids used, or crosslinked polymer particles, e.g. polystyrene or polymethyl methacrylate particles.

It is also possible to select mixtures of two or more of the abovementioned particle systems or mixtures of particle systems with the same chemical composition but different particle size. The particles are advantageously added to the polyester before melting begins.

If, besides the compound capable of activation by radiation, other particulate additives are present in the film, the total concentration of these particles is less than 20% by weight, based on the total weight of the film, preferably less than 15% by weight, and particularly preferably less than 5% by weight. The particulate additives have an average size ($d_{50}$ value) of from 0.01 to 15 μm, preferably from 0.03 to 10 μm, and particularly preferably from 0.05 to 1 μm. In one preferred embodiment, the proportion of particles with $d_{50}>3$ μm is smaller than 2000 ppm, and particularly preferably <1000 ppm.

It has been found that even films without other particulate additives (other than the metal component capable of activation by radiation) can be used in the invention. However, formation of the metal nuclei is improved if the film comprises silicon dioxide as filler within the particle sizes and maximum amounts mentioned above. For formation of the metal nuclei it has proven particularly advantageous for the film to comprise from 0.1 to 20.0% by weight, preferably from 0.5 to 15.0% by weight, and particularly preferably from 1.0 to 5.0% by weight, of silicon dioxide particles with $d_{50}<1$ μm.

The inventive film may comprise other additives, such as UV stabilizers, flame retardants, hydrolysis stabilizers, and antioxidants.

In another embodiment, the inventive film is flame-retardant. Flame-retardant means that in what is known as a fire protection test to UL94 VTM the film achieves at least the classification VTM-2. The film then comprises a flame retardant at a concentration in the range from 0.2 to 30% by weight, preferably from 0.5 to 25% by weight, particularly preferably from 1.0 to 20% by weight, based on the weight of the film. It is important that the flame retardant is soluble in the polyester, because otherwise the required mechanical properties are not achieved. Examples of suitable flame retardants are organic bromine, chlorine, or nitrogen compounds, or metal hydroxides or metal oxide trihydrates. However, the halogen compounds have the disadvantage that toxic and corrosive hydrogen halides are produced in the event of a fire. Another disadvantage is the low light-resistance of a film equipped therewith. Examples of other suitable flame retardants are organophosphorus compounds, such as carboxyphosphinic acids, their anhydrides, and dimethyl methanephosphonate. Very suitable flame retardants here are those in which the phosphorus compound has chemical bonding to the polyester. Very particular preference is given to bis(2-hydroxyethyl)[(6-oxido-6H-dibenzo [c,e][1,2]oxaphosphorin-6-yl)methyl]butane-dicarboxylate of the formula

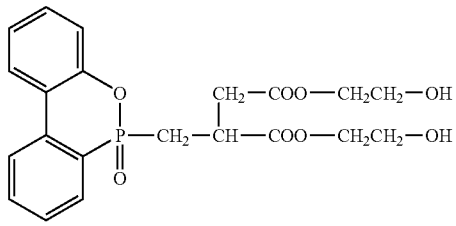

In this preferred embodiment, the inventive low-flammability film comprises, besides the polyester, the compound capable of activation by radiation, and, if appropriate, particulate additives, from 1 to 20% by weight of an organophosphorus compound as flame retardant soluble in the polyester.

Because the flame retardants generally have some susceptibility to hydrolysis, it may be advisable to add a hydrolysis stabilizer. Examples of suitable hydrolysis stabilizers are polymeric carbodiimides, e.g. ®Stabaxol P from Rheinchemie (DE). The amount of these preferably used is from 0.1 to 1.0% by weight (based on the weight of the film).

These abovementioned proportions of flame retardant and hydrolysis stabilizer have also proven advantageous when the main constituent of the film is not polyethylene terephthalate but another polyester.

The compound capable of activation by radiation and any other additives used, such as particles, UV stabilizers, flame retardants, hydrolysis stabilizers, and antioxidants, may be added in the form of a glycolic dispersion during the polycondensation process to the polyester used for the production of the inventive film. However, it is preferable to add the component capable of activation by radiation and/or any other additives used by way of masterbatches to the polyester during film extrusion.

The film may also be coated to establish other properties. Particularly typical coatings are coatings with adhesion-promoting, antistatic, slip-improving, or release action. Clearly, these additional layers may be applied to the film by way of in-line coating by means of aqueous dispersions after the longitudinal stretching and prior to the transverse stretching.

In one particular embodiment, at least one side of the film has a silicone coating, e.g. as described in U.S. Pat. No. 5,728,339. This embodiment has the advantage that after the laser treatment the surrounding regions have protection from the corrosive action of the electroplating bath, and that residues of the electroplating solution can be removed more easily from the film surface.

For certain applications, it can be advantageous to pretreat the surface of the film chemically, using an acid. For this "adhesion-promoting etch" particularly suitable compounds are trichloroacetic acid, dichloroacetic acid, or hydrofluoric acid, which act on the surface for a short time (from 5 to 120 seconds) and then are removed by means of an air knife. This gives the film a very reactive, amorphous surface.

The additives, i.e. the metal compound capable of activation by radiation, and also any other fillers and other additives present, may be introduced into the polymer by means of a commercially available twin-screw extruder (e.g. from Coperion). Here, inventive polyester pellets are introduced into the extruder together with the particles/additives and extruded, then quenched in a water bath, and then pelletized.

However, in one preferred process for preparing the inventive polyesters, the additives are added directly during the preparation of the polyester. In the case of the DMT process, the additives are usually added in the form of a glycolic dispersion after the transesterification or directly prior to the poly-condensation (e.g. by way of the transport line between transesterification and polycondensation vessels). However, the addition may also take place prior to the start of the transesterification. In the case of the TPA process, the addition preferably takes place at the start of the poly-condensation. However, later addition is also possible. In the case of this process it has proven advantageous to filter the glycolic dispersions through a PROGAF PGF 57 (Hayward Ind. USA) filter prior to addition.

The present invention also provides a process for producing the film. Production usually takes place via an extrusion process, for example on an extrusion line. It has proven particularly advantageous to add the component capable of activation by radiation and any other additives used, such as particles, UV stabilizers, flame retardants, hydrolysis stabilizers, and antioxidants, in the form of predried or precrystallized masterbatches, prior to the extrusion process.

In masterbatch technology it is preferable that the particle size and the bulk density of the masterbatches are similar to the particle size and the bulk density of the polyester used, thus achieving homogeneous dispersion, resulting in homogeneous properties.

The polyester films may be produced in the form of a single-layer film (monofilm) by known processes from a polyester and, if appropriate, from other raw materials, at least one component capable of activation by radiation, and also, if appropriate, other additives.

Masterbatches which comprise the component capable of activation by radiation have preferably been pre-crystallized and/or predried. The same applies to masterbatches which comprise particles, UV stabilizer(s), flame retardants, and/or other additives. The predrying includes progressive heating of the masterbatches under reduced pressure (from 20 to 80 mbar, preferably from 30 to 60 mbar, in particular from 40 to 50 mbar), with stirring, and, if appropriate, afterdrying at a constant elevated temperature (likewise under reduced pressure). It is preferable for the masterbatches to be charged batchwise at room temperature from a feed vessel in the desired blend together with the polyester and, if appropriate, with other raw material components into a vacuum dryer in which the temperature profile moves from 10 to 160° C., preferably from 20 to 150° C., in particular from 30 to 130° C., during the course of the drying time or residence time.

During the residence time of about 6 hours, preferably 5 hours, in particular 4 hours, the raw material mixture is stirred at from 10 to 70 rpm, preferably from 15 to 65 rpm, in particular from 20 to 60 rpm. The resultant precrystallized or predried raw material mixture is afterdried in a downstream vessel, likewise evacuated, at temperatures of from 90 to 180° C., preferably from 100 to 170° C., in particular from 110 to 160° C., for from 2 to 8 hours, preferably from 3 to 7 hours, in particular from 4 to 6 hours.

In the preferred extrusion process for the production of the film, the molten polymer material with the additives is extruded through a flat film die and quenched in the form of a substantially amorphous prefilm on a chill roll. This film is then reheated and oriented in at least one direction—either in machine direction (MD) or in transverse direction (TD)—however preferably longitudinally and transversely, or transversely and longitudinally, or longitudinally, transversely, and again longitudinally and/or transversely. The film temperatures in the stretching process are generally above the glass transition temperature Tg of the polyester used by from 10 to 60° C., and the longitudinal stretching ratio is usually from 2.0 to 6.0, in particular from 3.0 to 4.5, the transverse stretching ratio usually being from 2.0 to 5.0, in particular from 3.0 to 4.5, the ratio for any second longitudinal and transverse stretching carried out usually being from 1.1 to 5.0. The longitudinal stretching may also be carried out simultaneously with the transverse stretching (simultaneous stretching) or in any conceivable sequence. The heat-setting of the film follows at oven temperatures of from 180 to 260° C., in particular from 220 to 250° C. The film is then cooled and wound.

In one preferred embodiment, the heat-setting takes place at from 220 to 250° C., and the film is relaxed transversely at this temperature by at least 1% (preferably at least 2%).

In another preferred embodiment, the heat-setting takes place at from 220 to 250° C., and the film is relaxed transversely at this temperature by at least 1% (preferably at least 2%), and then again transversely relaxed, again by at least 1% (preferably at least 2%) at temperatures of from 180 to 150° C. in the cooling phase.

In another preferred embodiment, the film is stretched in MD and TD by a factor of at least 3.0, this stretching taking place in a simultaneous frame. The heat-setting takes place at from 220 to 250° C., and the film is longitudinally and transversely relaxed by at least 1% at this temperature.

The inventive films have the required good mechanical properties. For example, the modulus of elasticity in at least one direction of the film (longitudinal direction (MD) and/or transverse direction (TD)) is at least 500 N/mm$^2$, preferably greater than 2000 N/mm$^2$, and particularly preferably greater than 4000 N/mm$^2$. The tensile strength values in at least one direction of the film (longitudinal direction (MD) and transverse direction (TD)) are greater than 50 N/mm$^2$, preferably greater than 100 N/mm$^2$, and particularly preferably greater than 150 N/mm$^2$. The elongation at break values in at least one direction of the film (longitudinal direction (MD) and/or transverse direction (TD)) are greater than 10%, preferably greater than 40%, and particularly preferably greater than 80%.

The shrinkage of the inventive film at 200° C. is not greater than 25% in any direction of the film (neither MD nor TD). Indeed, shrinkage at 200° C. is smaller than 15%, and preferably smaller than 5%.

It was more than surprising that use of the additives described, combined with the predrying and/or precrystallization described for the raw materials and with the process conditions described can produce, without technical problems (such as caking in the dryer or break-offs) a film which has the required property profile and is capable of activation by electromagnetic radiation. During the production process, no, or hardly any, deposits on the dies or evolution of gasses were observed, the result being that the inventive film has excellent mechanical properties, excellent optical properties, an excellent profile, and excellent layflat. It has excellent capability for orientation, and can therefore be produced reliably and cost-effectively.

It is moreover very surprising that it is also possible to reuse the recycled material without adversely affecting the mechanical properties of the film. Within the bounds of accuracy of measurement, there is no adverse effect on mechanical properties even in comparison with an unmodified film.

The combined properties of the inventive films make them suitable for a wide variety of applications, for example for printed circuit boards, ribbon cables, smart cards, RFID labels, membrane keyboards, and film-based circuits of any type.

The invention is further illustrated below using examples, but is not restricted thereto.

The individual properties were measured here to the following standards or by the following methods:

Test Methods

Mechanical Properties

Modulus of elasticity, tensile strength, elongation at break, and F5 value are measured longitudinally and transversely to ISO 527-1-2 with the aid of tensile strain measurement equipment (Zwick 010, Ulm, DE).

Shrinkage

Thermal shrinkage was determined on square film samples with an edge length of 10 cm. The specimens were measured precisely (edge length $L_0$) and heat-conditioned for 15 minutes at 200° C. in a convection oven. The specimens were removed and measured precisely at room temperature (edge length L). Shrinkage is given by the equation $$\text{shrinkage } [\%] = 100 \cdot (L_0 - L)/L$$

Standard Viscosity (SV) and Intrinsic Viscosity (IV)

Standard viscosity was measured—by a method based on DIN 53726—on a 1% strength solution in dichloroacetic acid (DCA) at 25° C. SV (DCA)=($\eta$rel−1)×1000. Intrinsic viscosity (IV) is calculated as follows from standard viscosity (SV)

$$IV = [\eta] = 6.907 \cdot 10^{-4} SV(DCA) + 0.063096 \, [\text{dl/g}]$$

Measurement of Average Diameter $d_{50}$

Average diameter $d_{50}$ was determined by means of a laser on a Malvern Mastersizer by the standard method (an example of other measurement equipment being the Horiba LA 500 or Sympathec Helos, which use the same principle of measurement). For this, the specimens were placed with water in a cell, which was then placed in the measurement equipment. The measurement procedure is automatic and also include the mathematical determination of $d_{50}$ values. The $d_{50}$ value here is defined as the value determined from the (relative) cumulative particle size distribution curve: the point of intersection of the 50% ordinate value with the cumulative curve immediately gives the desired $d_{50}$ value on the abscissa axis. FIG. 1 provides a graphical illustration of an exemplary particle size distribution and $d_{50}$ value determination.

Film Production

Polyester chips were mixed in the ratio stated in the examples and precrystallized in a fluidized-bed dryer at 155° C. for 1 minute, and then dried at 150° C. for 3 hours in a tower dryer, and melted in a single-screw extruder at 290° C. The molten polymer was extruded through a flat film die and drawn off by way of a take-off roll (roll temperature 20° C.). The film was stretched by a factor of 3.5 in the machine direction at 116° C. (film temperature in the stretching gap), and transverse stretching by a factor of 3.2 was carried out in a frame at 110° C. The film was then heat-set at 229° C., and relaxed by 1% transversely at temperatures of from 229 to 200° C., and again relaxed by 1% transversely at temperatures of from 180 to 150° C. The production speed (final film speed) is 300 m/min.

The final film thickness is 75 μm.

EXAMPLES

The following raw materials are used in the examples:

Masterbatch MB1:
10% by weight of PK3095 from Ferro and 90% by weight of polyethylene terephthalate (PET)

Masterbatch MB2:
10% by weight of PK3095 from Ferro and 90% by weight of polybutylene terephthalate (PBT)

Masterbatch MB3:
4% by weight of Aerosil TT600 $SiO_2$ particles from Degussa (Germany) ($d_{50}$ of agglomerates about 300 nm; primary particle $d_{50}$ about 50 nm) and 96% by weight of polyethylene terephthalate (PET)

Masterbatch MB4:
4% by weight of Aerosil TT600 $SiO_2$ particles from Degussa (Germany) ($d_{50}$ of agglomerates about 300 nm; primary particle $d_{50}$ about 50 nm) and 96% by weight of polybutylene terephthalate (PBT)

Masterbatch MB5:
4% by weight of Omyacarb BP $CaCO_3$ particles from Omya (USA) ($d_{50}$ of particles 22 μm) and 96% by weight of polyethylene terephthalate (PET)

Masterbatch MB6:
10% by weight of PK3095 from Ferro and 90% by weight of polyethylene naphthalate (PEN)

Masterbatch MB7:
4% by weight of Aerosil TT600 $SiO_2$ particles from Degussa (Germany) ($d_{50}$ of agglomerates about 300 nm; primary particle $d_{50}$ about 50 nm) and 96% by weight of polyethylene naphthalate (PEN)

Masterbatch MB8:
4% by weight of Hydrocarb 70 $CaCO_3$ particles with a $d_{50}$ value of 1.6 μm (Omya) (Germany) and 96% by weight of polyethylene terephthalate (PET)

Masterbatch MB9:
Masterbatch MB9 comprises 6% by weight of M-Ester from Sanko Co. Ltd. (CAS No. 63562-34-5) and 94% by weight of polyethylene terephthalate from KoSa.

Polymer P1:
100% by weight of RT49 polyethylene terephthalate from KoSa (Germany)

Polymer P2:
25% by weight of Aerosil 90 from Degussa (Germany), 5% by weight of PK3095 from Ferro, and 70% by weight of polybutylene terephthalate (PBT)

Polymer P3:
100% by weight of polybutylene terephthalate

Polymer P4:
100% by weight of polyethylene naphthalate

Example 1

50% by weight of MB1 are mixed with 25% by weight of MB3 and 25% by weight of P1, and further processed as stated above to give a 75 μm film. Properties can be found in Table 1.

Example 2

Example 1 was repeated, but also using 50% by weight of recycled material produced from the film from Example 1. Properties can be found in Table 1.

Example 3

50% by weight of MB1 were mixed with 50% by weight of P1, and further processed as stated above to give a 75 μm film. Properties can be found in Table 1.

Example 4

60% by weight of MB1 were mixed with 40% by weight of MB8, and further processed as stated above to give a 75 μm film. Properties can be found in Table 1.

Example 5

50% by weight of MB6 were mixed with 25% by weight of MB7 and 25% by weight of P4, and further processed as stated above to give a 75 μm film. Properties can be found in Table 1.

Example 6

50% by weight of MB1 were mixed with 40% by weight of MB3 and 10% by weight of P3, and further processed as stated above to give a 75 μm film. Properties can be found in Table 1.

Example 7

50% by weight of MB1 were mixed with 25% by weight of MB3 and 25% by weight of MB9, and further processed as stated above to give a 75 μm film. The film was subjected to a UL94 VTM fire test and achieved fire classification VTM-0. Other properties can be found in Table 1.

Comparative Example 1

Using polymer P2 (similar to the polymer from the example from EP-A-1 274 288), attempt was made to produce a 75 μm film as stated above. It proved to be impossible to orientate the film, because every attempt at stretching led to break-offs. It was impossible to produce a film.

Comparative Example 2

60% by weight of MB1 were mixed with 40% by weight of MB5, and further processed as stated above to give a 75 µm film. Only small amounts could be produced, because break-offs often occurred during stretching in the production process. It is impossible to produce the film cost-effectively. Properties can be found in Table 1.

Comparative Example 3

50% by weight of MB1 were mixed with 25% by weight of MB3 and 25% by weight of P1, and further processed as stated above to give a 75 µm film. However, heat-setting did not take place as described above at 229° C., but at 150° C., and no relaxation took place. Properties can be found in Table 1.

Conductor Track Production:

In the region of the conductor tracks to be applied, the films produced are irradiated by laser radiation generated by a diode-pumped Nd:YAG laser (in this case a Microline 3D IR 160 from LPKF AG (Germany)), using an intensity which generates very little ablation, associated with structured nucleation. After brief treatment in an ultrasound cleaning bath containing demineralized water, the film is passed through a commercially available chemically reductive copper-plating bath. Here, the conductor tracks are constructed in the irradiated regions.

Results of Conductor Track Production:

The conductor tracks generated were assessed visually by means of an optical microscope (incident light) at 20× magnification. The coherence of the copper layer was evaluated visually, and allocated to the following categories: good, less good, and poor.

electromagnetic radiation liberates a metal in elemental form within the polymer, said film exhibiting a modulus of elasticity in at least one film direction (longitudinal (MD) and/or transverse (TD)) of greater than 500 N/mm$^2$.

2. The polyester film as claimed in claim 1, wherein the amount of the metal compound present in the film is from 0.1 to 15.0% by weight.

3. The polyester film as claimed claim 1, which comprises particulate additives.

4. The polyester film as claimed in claim 3, wherein said particulate additive is silicon dioxide.

5. The polyester film as claimed in claim 3, wherein said particulate additive has an average particle size, $d_{50}$, of from 0.01 to 15 µm.

6. The polyester film as claimed claim 1, which comprises a flame retardant.

7. The polyester film as claimed claim 6, which comprises a hydrolysis stabilizer.

8. The polyester film as claimed claim 1, which has a silicone coating on at least one surface.

9. The polyester film as claimed claim 1, wherein at least one layer is composed of a polyester which contains, as dicarboxylic acid component, from 10 to 100 mol % of terephthalate, based on the total amount of the dicarboxylic acid components present.

10. The polyester film as claimed claim 1, wherein at least one layer is composed of a polyester which contains, as dicarboxylic acid component, from 10 to 100 mol % of 2,6-naphthalate, based on the total amount of the dicarboxylic acid components present.

TABLE 1

| | MD modulus of elasticity in N/mm$^2$ | TD modulus of elasticity in N/mm$^2$ | MD tensile strength in N/mm$^2$ | TD tensile strength in N/mm$^2$ | MD elongation break in % | TD elongation break in % | MD shrinkage 200° C. | TD shrinkage 200° C. | Conductor task production |
|---|---|---|---|---|---|---|---|---|---|
| Example | | | | | | | | | |
| 1 | 4100 | 5800 | 185 | 290 | 168 | 100 | 4.5 | 1.9 | good |
| 2 | 4000 | 5700 | 184 | 291 | 170 | 105 | 4.4 | 2.0 | good |
| 3 | 4000 | 5400 | 170 | 281 | 162 | 98 | 4.4 | 2 | less good |
| 4 | 4200 | 5500 | 175 | 285 | 165 | 95 | 4.4 | 2 | good |
| 5 | 4300 | 6100 | 176 | 300 | 155 | 90 | 4.7 | 2.3 | good |
| 6 | 3900 | 5000 | 165 | 210 | 172 | 110 | 3.5 | 1 | good |
| 7 | 4000 | 5200 | 172 | 230 | 170 | 115 | 5.5 | 3 | good |
| Comparative Example | | | | | | | | | |
| 1 | no film obtained | no film obtained | no film obtained | no film obtained | no film obtained | no film obtained | no film obtained | no film obtained | no film obtained |
| 2 | 4000 | 5500 | 50 | 25 | 15 | 5 | 4.5 | 2 | poor |
| 3 | 4200 | 5900 | 190 | 298 | 200 | 110 | 22 | 28 | good*) |

*)Creases formed after laser irradiation

The invention claimed is:

1. A single-layer at least monoaxially oriented polyester film with a total thickness of from 5 to 500 µm, which comprises a metal compound which on irradiation with 11. The polyester film as claimed claim 1, which has tensile strength values in at least one film direction (longitudinal (MD) and/or transverse (TD)) of greater than 50 N/mm$^2$.

12. The polyester film as claimed claim 1 which has elongation at break values in at least one film direction (longitudinal (MD) and/or transverse (TD)) of greater than 10 N/mm².

13. The polyester film as claimed claim 1, which does not have shrinkage greater than 25% at 200° C. in any film direction (Md or TD).

14. A process for producing a polyester film as claimed in claim 1, which comprises extruding, together through a flat film die, a polyester and a metal compound which on irradiation with electromagnetic radiation liberates a metal in elemental form within the polyester, cooling, reheating, and then orienting in at least one direction and ten heat-setting.

15. Printed circuit boards, ribbon cables, smart cards, RFID labels, membrane keyboards, and film-based circuits comprising a film according to claim 1.

16. The A single-layer at least monoaxially oriented polyester film with a total thickness of from 5 to 500 μm, which comprises a metal compound which on irradiation with electromagnetic radiation liberates a metal in elemental form within the polymer, wherein the metal compound is a metal oxide.

17. The polyester film as claimed in claim 16, wherein the metal compound is a spinel.

18. The polyester film as claimed in claim 16, wherein the metal compound is $CuCr_2O_4$.

19. Films comprising metal compound which on irradiation with electromagnetic radiation liberates metal in elemental form, said film exhibiting a modulus of elasticity in at least one film direction (longitudinal (MD) and/or transverse (TD)) of greater than 500 N/mm².

20. Printed circuit boards, ribbon cables, smart cards, RFID labels, membrane keyboards, and film-based circuits comprising film as claimed in claim 19.

* * * * *

UNITED STATES PATENT AND TRADEMARK OFFICE
CERTIFICATE OF CORRECTION

PATENT NO. : 7,105,223 B2 Page 1 of 1
APPLICATION NO. : 10/941715
DATED : September 12, 2006
INVENTOR(S) : Kliesch et al.

It is certified that error appears in the above-identified patent and that said Letters Patent is hereby corrected as shown below:

Column 13
Claim 14, Line 13, delete "ten" insert --then--
Claim 16, Line 18, delete "The"

Signed and Sealed this

Twenty-first Day of November, 2006

JON W. DUDAS
*Director of the United States Patent and Trademark Office*